(12) United States Patent
Schuda

(10) Patent No.: US 7,095,763 B2
(45) Date of Patent: Aug. 22, 2006

(54) SEMICONDUCTOR WAFER CARRIER MAPPING SENSOR

(75) Inventor: Felix J. Schuda, Saratoga, CA (US)

(73) Assignee: CyberOptics Semiconductor, Inc., Portland, OR (US)

( * ) Notice: Subject to any disclaimer, the term of this patent is extended or adjusted under 35 U.S.C. 154(b) by 278 days.

(21) Appl. No.: 10/320,756

(22) Filed: Dec. 16, 2002

(65) Prior Publication Data
US 2003/0141465 A1 Jul. 31, 2003

Related U.S. Application Data

(60) Provisional application No. 60/341,494, filed on Dec. 17, 2001.

(51) Int. Cl.
H01S 3/13 (2006.01)

(52) U.S. Cl. ............................... 372/29.02; 372/29.014; 250/559.4; 250/559.47

(58) Field of Classification Search ............. 372/29.02; 250/559.4, 559.47
See application file for complete search history.

(56) References Cited

U.S. PATENT DOCUMENTS

| | | | |
|---|---|---|---|
| 3,815,998 A | 6/1974 | Tietze | 356/120 |
| 4,786,816 A | 11/1988 | Ohmori et al. | 250/561 |
| 4,994,666 A | 2/1991 | Higgison et al. | 250/222.2 |
| 5,121,160 A | 6/1992 | Sano et al. | 355/53 |
| 5,225,691 A | 7/1993 | Powers et al. | 250/561 |
| 5,354,995 A | 10/1994 | Endo et al. | 250/561 |
| 5,479,252 A | 12/1995 | Worster et al. | 356/237 |
| 5,546,179 A | 8/1996 | Cheng | 356/73 |
| 5,710,424 A * | 1/1998 | Theodoras et al. | 250/208.2 |
| 5,719,617 A | 2/1998 | Takahashi et al. | 347/241 |
| 5,943,130 A * | 8/1999 | Bonin et al. | 356/336 |
| 6,091,488 A | 7/2000 | Bishop | 356/237.5 |
| 6,100,976 A * | 8/2000 | Ackerson | 356/336 |
| 6,130,437 A * | 10/2000 | Cerny et al. | 250/559.4 |
| 6,147,356 A | 11/2000 | Hahn et al. | 250/559.29 |
| 6,160,615 A | 12/2000 | Matsui et al. | 356/237.4 |
| 6,164,894 A | 12/2000 | Cheng | 414/416 |
| 6,177,989 B1 | 1/2001 | Bruce | 356/237.5 |
| 6,226,079 B1 | 5/2001 | Takeda et al. | 356/237.2 |
| 6,303,939 B1 | 10/2001 | Chung et al. | 250/559.29 |
| 6,381,078 B1 * | 4/2002 | Yamaguchi et al. | 359/738 |
| 6,560,265 B1 * | 5/2003 | Hwang et al. | 372/96 |
| 6,592,040 B1 * | 7/2003 | Barkan et al. | 235/472.01 |
| 2003/0128917 A1 * | 7/2003 | Turpin et al. | 385/24 |

FOREIGN PATENT DOCUMENTS

| | | | |
|---|---|---|---|
| EP | 0 564 264 A1 | 10/1993 | 7/20 |
| GB | 1 214 148 | 12/1970 | |
| JP | 59-17139 | 1/1984 | |

* cited by examiner

Primary Examiner—Minsun Oh Harvey
Assistant Examiner—Dung Nguyen
(74) Attorney, Agent, or Firm—Westman, Champlin & Kelly, P.A.

(57) ABSTRACT

An improved laser-based wafer carrier mapping sensor is provided. The sensor includes a number of improvements including laser source improvements; optical improvements; and detector improvements. Laser source improvements include the type of laser sources used as well as the specification of size and power of such sources. Optical improvements include features that intentionally defocus the laser stripe on the wafer as well as additional features that help ensure precision stripe generation. Detector improvements include increasing gain while decreasing the effects of ambient light. Various combinations of these features provide additional synergies that facilitate the construction of a sensor with significantly improved dynamic response while decreasing the frequency of false cross slot errors.

14 Claims, 4 Drawing Sheets

SEMICONDUCTOR WAFER CARRIER MAPPING SENSOR

CROSS-REFERENCE OF CO-PENDING APPLICATIONS

The present application claims priority to previously filed co-pending provisional application Ser. No. 60/341,494, filed Dec. 17, 2001, entitled IMPROVED MAPPING SENSOR, which application is incorporated herein by reference in its entirety.

BACKGROUND OF THE INVENTION

Wafer carrier mapping sensors are used in the manufacture and processing of semiconductor wafers to detect wafers in a wafer carrier. In order to effectively process the wafers in the carrier, the semiconductor tool must know which positions within the carrier have wafers, and whether those wafers are properly held therein. Wafer carrier mapping sensors scan the wafer edges to detect wafer absence/presence and additionally errors such as cross slots. "Cross slots" are wafer position errors where the wafer is not maintained in a single "slot" but erroneously spans a pair of slots. In this situation, it is important that the tool not attempt to interact with the wafer, but instead generate an error.

Wafer carrier mapping systems have begun to face a difficult challenge recently with the increasing use of dark wafers typically with nitride coatings. While mapping systems can be adjusted to optimally detect the traditionally light wafers, such as copper or aluminum coated silicon wafers, or the dark nitride wafers, sensing systems do not adequately deal with mixes of both light and dark wafers. For example, if a system is optimally adjusted for dark wafers, the illumination level and detector gain may be so high that when the sensing system is faced with a light wafer, an erroneous signal such as a false cross slot error is declared. Conversely, when a system is optimally adjusted for light wafers, a dark wafer may fail to register well enough to make its presence known. Unfortunately, adjusting the sensing system to compromise between these two extremes essentially creates a worse situation in which false cross slot errors still occur, and some dark wafers are not detected at all.

There exists a need to provide a wafer carrier mapping system that can reliably detect not only wafer presence within a carrier containing a mixture of light and dark wafers but also reduce or eliminate false errors. Such a system would reduce technician intervention since one sensing system would accommodate both types of wafers. Moreover, sensor credibility would be increased since technicians would not need to second guess each cross slot error to determine if it was in fact a false error.

SUMMARY OF THE INVENTION

An improved laser-based wafer carrier mapping sensor is provided. The sensor includes a number of improvements including laser source improvements; optical improvements; and detector improvements. Laser source improvements include the type of laser sources used as well as the specification of size and power of such sources. Optical improvements include features that intentionally defocus the laser stripe on the wafer as well as additional features that help ensure precision stripe generation. Detector improvements include increasing gain while decreasing the effects of ambient light. Various combinations of these features provide additional synergies that facilitate the construction of a sensor with significantly improved dynamic response while decreasing the frequency of false cross slot errors.

DETAILED DESCRIPTION OF THE PREFERRED EMBODIMENTS

Embodiments of the present invention are directed to increasing the effective dynamic range of laser-based wafer carrier mapping sensors. Various features and combinations thereof have been explored that synergistically provide significantly advanced wafer detection. These features will be set forth below individually, but it is expressly contemplated that embodiments of the invention are not limited to the individual features but also include the vast array of combinations thereof.

Figure 1:
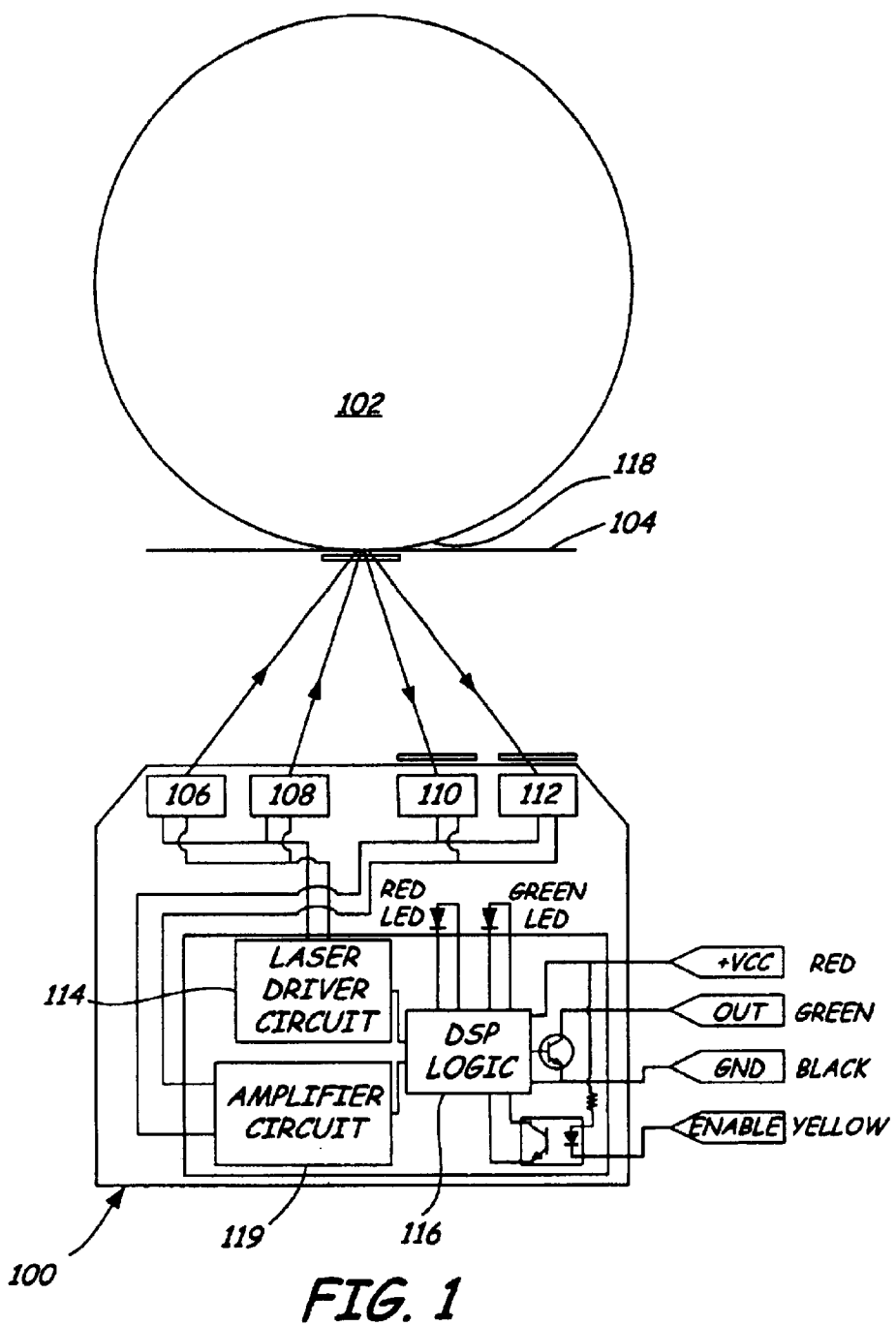
FIG. 1 is a diagrammatic view of an improved wafer carrier mapping system in accordance with embodiments of the present invention.

FIG. 1 is a diagrammatic view of a wafer carrier mapping system in accordance with embodiments of the present invention. FIG. 2 shows a sensor geometry that is more optimum for on-axis applications. Sensor 100 is arranged to detect wafers such as wafer 102 in carrier 104. One example of carrier 104 is a Front Opening Unified Pod (FOUP) Two laser sources, preferably laser diodes, 106 and 108 shine respectively into detectors 110 and 112, when reflected from wafer edge 118. Each of sources 106, 108 is coupled to laser driver circuit 114 which provides suitable energization signals to sources 106, 108. Laser driver circuit 114 is coupled to DSP logic 116 which provides control signals to laser driver circuit 114. DSP logic 116 is also coupled to amplifier circuit 119 which receives signals from detectors 110, 112 (which are preferably phototransistors) and amplifies such signals for effective detection. This is the preferred geometry for on-axis detection as here wafer edge 118 is expected to be largely specular, and where the wafers do not have flats. However, embodiments of the present invention are useful for both on-axis and off-axis wafer detection.

One aspect of embodiments of the present invention is the laser source. Each source 106, 108 is preferably a laser diode. Laser sources are selected to provide a power output that is near, but within the maximum power allowed under the lowest regulatory laser classifications (CDRH class 1 and IEC-80625-1 class 1) in order to facilitate industry adoption. If laser intensity exceeds this specification, it is believed that equipment manufacturers would be required to provide relatively elaborate and costly laser safety precautions thus militating against use of such a sensor. However, in embodiments where higher intensity is not a concern, such intensity can be used in accordance with embodiments of the present invention.

Another aspect of the laser source specification includes providing a laser output having a wavelength at or near the peak responsivity wavelength of the phototransistor detector. In a preferred embodiment, the detector has a peak responsivity of about 900 nm, and thus the sources were selected to provide a laser wavelength at 850 or 900 nm. Note, however, these wavelengths are illustrative of a preferred arrangement, and such matching is not so limited. An additional benefit of using an increased laser wavelength is that it allows more power near the peak detector responsivity wavelength while still staying within the Class 1 specification. Additionally, sources 106, 108 are selected to have a small laser active emission area such that they provide relatively tight beams. Preferably such sources are commercially available edge-emission photodiodes having an emission area of approximately 4×20 microns. However, other types of laser sources can be used in accordance with embodiments of the present invention such as vertical cavity laser sources.

Figure 2A:
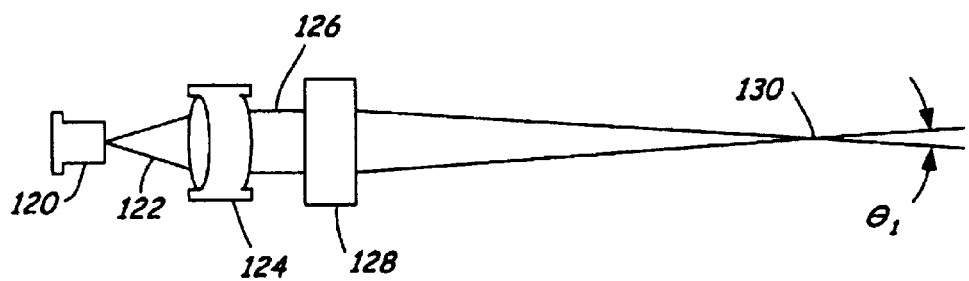
FIG. 2A is a diagrammatic view of a laser source and optics in accordance with the prior art.

Increasing laser output alone could conceivably generate increased false cross slot errors as described above. However, additional aspects of embodiments of the present invention ensure that the laser stripe generated on the wafer by the laser will be precisely formed. FIG. 2A is a diagrammatic view of a laser source and associated optics arranged in accordance with the prior art. Source 120 generates diverging laser beam 122, which enters focusing optics 124 and emerges as a beam 126 focussed near to the wafer edge. The beam 126 passes through cylinder lens 128 which diverges the light in the horizontal plane. However, in the vertical plane the beam is focused at point 130, after which it diverges at an angle $\theta_1$.

Figure 2B:
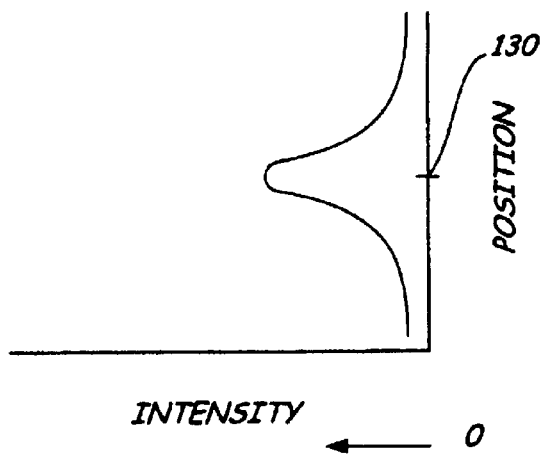
FIG. 2B is a laser intensity diagram illustrating a representative laser intensity distribution generated from the arrangement of FIG. 2A.

FIG. 2B illustrates a representative intensity distribution of the focused beam illustrated in FIG. 2A as the beam impinges upon a wafer. The vertical axis of FIG. 2B represents vertical position on the wafer. The distribution has a bell-curve with the highest intensity corresponding to focal point 130. However, the peak is not as sharp as it could be, and the sides of the peak can include enough intensity that false cross slot errors could occur.

Figure 3A:
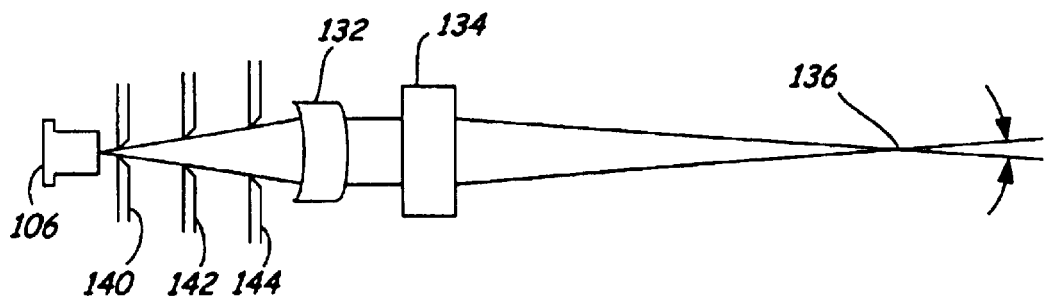
FIG. 3A is a diagrammatic view of a laser source and optics in accordance with an embodiment of the present invention.

FIG. 3A is a diagrammatic view of a laser source 106 and associated optics arranged in accordance with an embodiment of the present invention. Two main features are illustrated in FIG. 3A; defocusing optics and one or more optical stops.

Defocusing is provided by selecting the focal lengths and positioning of focusing lens 132 and cylinder lens 134 such that focal point 136 is either in front of, or behind the anticipated wafer edge. Lenses 132, 134 are preferably formed of materials that will scatter the smallest amount of the light. Glass is often used instead of plastic to reduce optical scatting caused by imperfections therein. Focusing lens 132 reduces the degree of divergence of light passing therethrough, and preferably has a relatively large focal length, such as 8–15 mm, which is in distinct contrast to the smaller focal lengths, such as 4.5 mm used in conventional systems. This arrangement provides at least two advantages.

First, since the beam beyond focal point 136 diverges at an angle $\theta_2$ that is larger than $\theta_1$ (shown in FIG. 2A), increased laser source power can be employed while staying within the CDRH Class 1. This is because the intensity of light at the testing aperture, located 200 mm from the beam crossover point, is spread over a larger area. Thus, since the light gathered by the laser classification aperture, of a fixed size, is smaller, sources 106, 108 can have higher power.

Figure 3B:
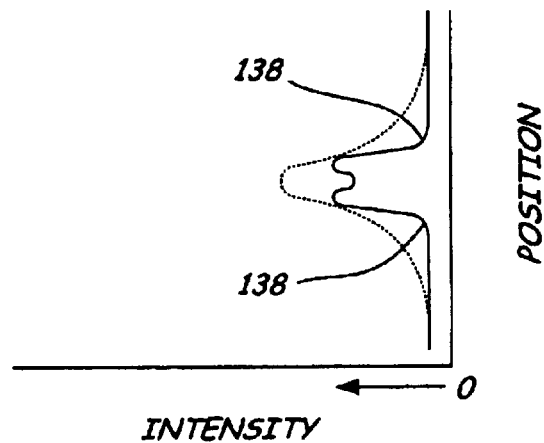
FIG. 3B is a laser intensity diagram illustrating a representative laser intensity distribution generated from the arrangement of FIG. 3A and showing a contrast with FIG. 2B.

Second, increasing the focal length of lens 132 causes the magnification ratio to be less thereby generating the intensity distribution illustrated in the solid line in FIG. 3B. For reference, the image from FIG. 2B is superimposed in FIG. 3B in phantom. As can be seen, the intensity at the center of the distribution is actually not the maximum. Instead, the distribution includes a pair of peaks. One of the primary benefits of this distribution is that the areas 138 have a lower intensity than that of FIG. 2B. In the prior art, the intensity of this "skirt" at 1 mm from the stripe center would be more than ¹⁄₅₀₀th or ¹⁄₁₀₀₀th of the peak intensity. In sensors embodying aspects of the invention, this intensity is reduced to about ¹⁄₁₀₀₀₀th, or an entire order of magnitude. The "skirt" portion is not present by design, but is instead a byproduct of the laser system and optics. Various elements in the laser, and/or associated optics may redirect a very small part of the beam into the skirt region. However, as overall intensity is increased and detector gain are increased, it is this region that is believed to be at least partially responsible for false cross slot errors. For example, the "skirt" on bright wafers can appear very thick (3 to 7 mm). This apparent thickness can lead the mapping software in the robot or loadport to read the bright, shiny wafer as cross-slotted and shut down the equipment.

Yet another advantage provided by the increased focal length of focusing lens 132 is that it allowed room for optical stops. FIG. 3A illustrates optical stops 140, 142, and 144, which are disposed to facilitate precision formation of the laser stripe upon the wafer. As used herein, optical stops are intended to mean any device inserted into the optical train that has the effect of blocking unwanted illumination. This is in contrast to inherent stops already present in the components themselves. Stops 140, 142 and 144 are very helpful in keeping the scattered light to a minimum and reducing the level of illumination in region 138. Preferably, stop 140 is an aperture that can have a diameter of 200 microns or less and is mounted very close to the actual laser chip, such as within 300 microns, so that the only illumination emerging therefrom passes through stop 140. In some embodiments, where the laser source includes a physical package, stop 140 can be mounted directly to the physical package. Additional stops 142 and 144 further refine the emerging laser beam.

Embodiments of the present invention also include features that increases the sensitivity of the detector(s) and/or reduce the effects of extraneous light. Detectors 110, 112 (shown in FIG. 1) are preferably phototransistors or silicon photodiodes. Detectors 110, 112 are preferably arranged to have a Field Of View (FOV) that is just large enough to see the laser stripe and the wafer even when the stripe is disposed totally scattered by a wafer notch. Such notches are typically 3 mm long, and thus it is preferred that the FOV be 6 mm such that contrast can be seen on either side of such a notch. In one embodiment, illustrated in FIG. 4, a lens 150 is disposed in front of detector 110 such that an image of the stripe is focused upon detector 110. Preferably, lens 150 has a focal length of about 10–20 mm.

Figure 4:
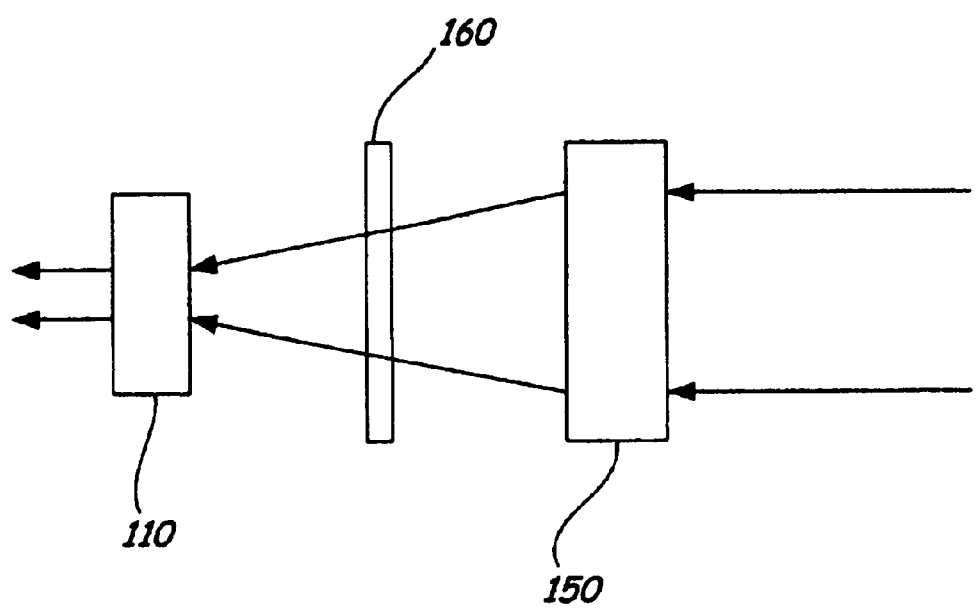
FIG. 4 is a diagrammatic view of a detector and optics in accordance with an embodiment of the present invention.

FIG. 4 illustrates another detector feature in accordance with an embodiment of the present invention. Detectors 110, 112 are preferably set to have very high gain. Given this feature, it is even more important to reduce the effects of ambient light. Thus, ambient light filter 160 is operably disposed in front of detector 110 such that ambient light is generally obstructed. Ambient light entering the detector can artificially increase the gain of the detector, leading to an unforeseen and uncontrolled change to the sensor sensitivity. Although FIG. 4 illustrates detector features with respect to only detector 110, such features are preferably applied to both detectors.

Although the present invention has been described with reference to preferred embodiments, workers skilled in the art will recognize that changes may be made in form and detail without departing from the spirit and scope of the invention. While embodiments of the invention may include any of the advanced features described above, additional embodiments may also include various combinations thereof to advantageously realize synergies therebetween. For example, matching the source output frequency to peak detector response not only allows more efficient detection, but higher laser power as well. Further, using a collimating lens with a larger focal length not only provides the benefits of defocusing, but also creates room to insert optical stops to form the laser stripe even more precisely while allowing yet another increase in laser power.

By so employing combinations of the features listed above, an improved laser-based wafer carrier mapping system has been realized that can reliably detect both bright and dark wafers when such wafers are heterogeneously mixed within a wafer carrier. This allows a single wafer carrier mapping sensor to be reliably used without requiring extensive technician intervention and setup.

What is claimed is:

1. A wafer carrier mapping sensor comprising:
   at least one laser source adapted to generate a diverging laser beam;
   a focusing lens disposed to receive the diverging laser beam and focus the beam near a wafer edge;
   a cylinder lens disposed to receive the beam and diverge the beam in a first direction, generating a stripe;
   a detector adapted to receive laser light reflected from the wafer edge to produce a sensor output signal; and
   wherein the focal point is spaced from the wafer edge to reduce skirt illumination.

2. The sensor of claim 1, wherein the focusing lens has a focal length of at least about 8 mm.

3. The sensor of claim 1, and further comprising at least one optical stop positioned in front of the at least one laser source.

4. The sensor of claim 3, wherein the at least one optical stop includes three optical stops.

5. The sensor of claim 3, wherein the at least one optical stop is disposed directly upon a physical package of the at least one laser source.

6. The sensor of claim 3, wherein the at least one laser source includes a laser diode chip, and wherein the at least one optical stop is disposed within about 300 microns from the chip.

7. The sensor of claim 3, wherein the at least one optical stop includes an aperture having a diameter of no larger than about 200 microns.

8. The sensor of claim 1, wherein the at least one laser source is configured to provide laser light having a laser frequency to maximize laser power allowed under Class 1.

9. The sensor of claim 1, wherein the at least one laser source is configured to provide laser light at a laser frequency selected to maximize sensitivity of a commercially available detector.

10. The sensor of claim 1, wherein the at least one laser source is configured to operate at a maximum allowable power under at least one of CDRH Class 1 and IEC-80625-1 Class 1.

11. The sensor of claim 1, and further comprising a lens disposed in front of the detector to increase the light collection of the detector.

12. The sensor of claim 11, wherein the detector field of view is larger than an anticipated wafer notch size.

13. The sensor of claim 1, and further comprising an ambient light filter disposed in front of the detector.

14. A wafer carrier mapping sensor comprising:
   a detector adapted to sense a laser stripe on a wafer edge to provide a signal indicative thereof;
   a laser stripe generator for generating a laser stripe having a width in a first direction greater than a height in a second direction, a center and a peak intensity at the center; and
   wherein the stripe includes a region spaced from the center 1 mm in the second direction, and wherein an intensity at the region is less than or equal to about $1/10000$ of the peak intensity.

* * * * *

UNITED STATES PATENT AND TRADEMARK OFFICE
CERTIFICATE OF CORRECTION

PATENT NO.         : 7,095,763 B2                                         Page 1 of 1
APPLICATION NO. : 10/320756
DATED              : August 22, 2006
INVENTOR(S)       : Schuda It is certified that error appears in the above-identified patent and that said Letters Patent is hereby corrected as shown below:

Title Page; please insert;

References Cited (56):

| | | | |
|---|---|---|---|
| -- 6,900,451 | 05/31/05 | Kesil et al. | 250/559.36 -- |
| -- 5,504,345 | 04/02/96 | Bartunek et al. | 250/559.4 -- |
| -- 4,304,467 | 12/08/81 | Rabedeau | 350/449 -- |
| -- 4,701,928 | 10/20/87 | Fan et al. | 382/68 -- |

Signed and Sealed this

Fourth Day of March, 2008

JON W. DUDAS
*Director of the United States Patent and Trademark Office*